United States Patent [19]

Pinkhasov

[11] 4,438,153
[45] Mar. 20, 1984

[54] METHOD OF AND APPARATUS FOR THE VAPOR DEPOSITION OF MATERIAL UPON A SUBSTRATE

[75] Inventor: Eduard Pinkhasov, Forest Hills, N.Y.

[73] Assignee: Welbilt Electronics Die Corporation, Bronx, N.Y.

[21] Appl. No.: 358,186

[22] Filed: Mar. 15, 1982

Related U.S. Application Data

[63] Continuation-in-part of Ser. No. 237,670, Feb. 14, 1981, Pat. No. 4,351,855.

[51] Int. Cl.³ ............................ B05B 1/24; C23C 13/00
[52] U.S. Cl. ............................. 427/37; 118/723; 118/726; 427/250; 427/295; 427/422
[58] Field of Search ............... 427/34, 37, 250, 295, 427/422; 118/720, 723, 726

[56] References Cited

U.S. PATENT DOCUMENTS

| | | | |
|---|---|---|---|
| 1,221,104 | 4/1917 | Stolle | 427/34 |
| 3,010,009 | 11/1961 | Ducati | 427/34 |
| 3,036,549 | 5/1962 | Iwata et al. | 118/726 |
| 3,925,177 | 12/1975 | Kofold | 427/37 |
| 4,333,962 | 6/1982 | Pulker et al. | 427/37 |

FOREIGN PATENT DOCUMENTS 18970 of 1914 United Kingdom .
1257015 12/1971 United Kingdom .

OTHER PUBLICATIONS

Nade et al. "Japanese Journ. of App. Phys." vol. 10, No. 6, Jun. 1971, pp. 747–753.

*Primary Examiner*—John H. Newsom
*Attorney, Agent, or Firm*—Karl F. Ross; Herbert Dubno

[57] ABSTRACT

A method of and apparatus for depositing material upon a surface, e.g. to coat the surface or to form compounds containing this material by bonding with the substrate material of the surface, in which an arc is struck between at least one solid electrode and a pool of molten metal to vaporize the molten metal and permit transfer of the metal vapors to the substrate.

10 Claims, 6 Drawing Figures

METHOD OF AND APPARATUS FOR THE VAPOR DEPOSITION OF MATERIAL UPON A SUBSTRATE

CROSS REFERENCE TO RELATED APPLICATION

This application is a continuation in part of Ser. No. 237,670 filed Feb. 14, 1981, now U.S. Pat. No. 4,351,855.

REFERENCE TO DISCLOSURE DOCUMENTS

The present invention also relates to subject matter contained in disclosure documents Ser. Nos. 078,337 filed Feb. 26, 1979, 078,334 filed Feb. 25, 1979, 078,329 filed Feb. 26, 1979 and 082,283 filed July 5, 1979, hereby included by reference in their entireties.

FIELD OF THE INVENTION

My present invention relates to vapor deposition and, more particularly, to a method of and to an apparatus for effecting vapor deposition of a material, generally a metal, upon a substrate. Specifically the invention relates to a method of and an apparatus for applying anticorrosion, protective, decorative or semiconductor coatings upon a substrate or the formation of compounds on the substrate with material deposited thereon, e.g. in the formation of carbides, borides, silicides, nitrides and silicon carbide.

BACKGROUND OF THE INVENTION

In the deposition of materials from a vapor phase onto a substrate, a process which is generally carried out in vacuum, the material to be deposited upon the substrate is generally vaporized with high energy and caused to migrate to the substrate at which deposition takes place.

Prior techniques for the generation of vapor by the heating of a body of the substance to be deposited do not always result in satisfactory uniform deposits over large surface areas.

OBJECTS OF THE INVENTION

It is the principal object of the present invention to provide an improved method of and apparatus for the deposition of a material upon a substrate whereby disadvantages of prior art techniques are avoided.

Another object of this invention is to provide a method of depositing from a vapor phase materials of different composition, including practically all existing metals and alloys, on practically any substrate in a highly uniform manner at low operating cost and with high energy efficiency.

Yet another object of the invention is to provide a method of and apparatus for the high speed coating of large-area surfaces.

It is also an object of the invention to provide an improved method of forming silicides, carbides and other compounds on a substrate.

SUMMARY OF THE INVENTION

These objects and others which will become apparent hereinafter are attained, in accordance with the present invention, in a method for vapor depositing a material upon a substrate which comprises the step of striking an electric arc between a pool of molten material to be vaporized, thereby directly vaporizing the material on the surface of the pool and permitting transfer of the vaporized material in the vapor state to the substrate, e.g. in a vacuum chamber.

According to the invention, the pool of molten metal can be formed also by the electric arc, e.g. by striking this arc between an electrode and a body of the material to be deposited. Advantageously, the body of the material to be vaporized has a larger cross section than the arc-striking electrode so that a pool is formed of the molten material in a cavity of this body. This, of course, eliminates the need for a crucible or container for the pool of the molten material.

It has been found to be advantageous to move the electrode into and out of contact with the pool of molten metal, thereby depositing some of the melt upon the electrode and permitting the heating of the electrode tip to vaporize at least in part the material which is to be deposited upon the substrate.

Alternatively or in addition, a crucible or container can be provided for the bath or pool of the molten material and the arc can be struck at the upper surface of this bath or the material can be permitted to percolate downwardly from the melt, e.g. through openings in the crucible, to an arc struck therebelow at which vaporization is effected.

According to yet another feature of the invention, the crucible or container for the melt can comprise a sphere formed with the electrode which extends along a diameter of the sphere, preferably vertically, with the sphere being laterally open, e.g. through a vacuum lock, into an outwardly widening chamber which terminates at the substrate.

At least the initial vacuum is generated to be of the order of $10^{-6}$ torr or lower while the operating vacuum is maintained at a maximum of $10^{-5}$ torr. The arc current should be between 100 to 250 amperes across a voltage of 70 to 120 volts direct current, for deeper vacuums and greater currents than have generally been used heretofore, generating deposition speeds of 0.10 to 0.30 grams per minutes.

The system of the present invention can be used for generating silica, silicide or carbide coatings upon the substrate, for producing silicides by the reaction of silicon with a substrate material upon deposition of the silicon upon that substrate, or for coating substrates with practically any desired metal or alloy to form protective coatings or coatings for other purposes. The system can be used in the metallurgical, chemical, electrical, electronic, electrovacuum, optical, rocketry and aerospace and nuclear industries and has been found to be especially effective for the generation of mirror-like coatings, reflectors, anti-corrosion coatings and films for products of flat or intricate configuration, for producing multilayer coatings in films, e.g. for semiconductor components and high-ohmic resistance components, and simply wherever surface modification of a substrate is required and can be effected by transfer from the vapor phase of a material which can exist in molten form to the substrate. Metal nitride coatings can be formed when nitrogen is admitted to the evacuated space, which can have its vacuum stabilized at about $2.5 \times 10^{31}$ 3 torr. The vaporized electrode metal combines with nitrogen and the corresponding nitrides are deposited.

In a two-electrode system, forming compounds in situ from materials of both electrodes, the metal electrode can be high purity Ti, W, Al, Cu while the other electrode can be a silicide, boride or carbide so that the deposit is a silicide, boride or carbide of the high purity metal. When one electrode is graphite or a carbide and the other electrode is a silicide, silicon carbide is formed in the arc and deposited. When both electrodes are silicides or borides, silicides or borides, respectively are produced.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
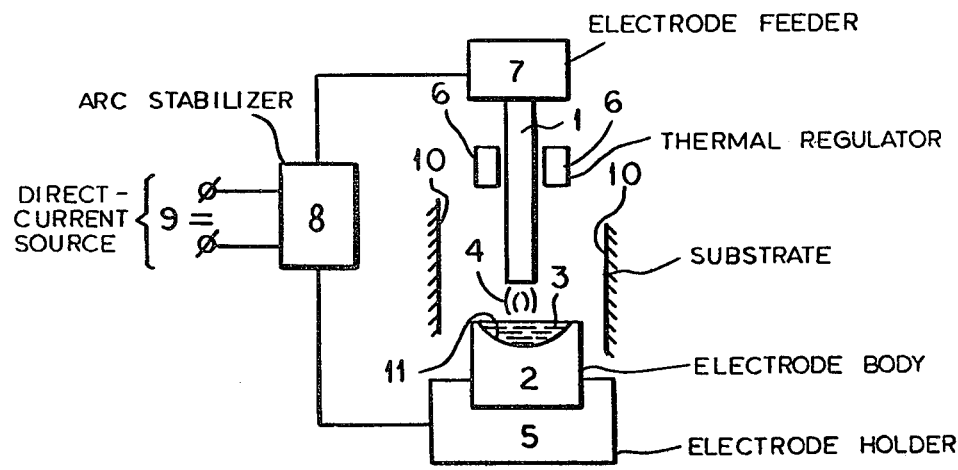
FIG. 1 is a diagram in elevational view illustrating an apparatus for carrying out vapor deposition in accordance with an embodiment of the present invention.

In FIG. 1 I have shown a system utilizing a simple arc method in accordance with the present invention for obtaining mirror-like protective coatings upon substrates or for evaporating various metals or metal alloys, including heatresistant and refractory metals, to apply coatings thereof to the substrate.

Figure 6:
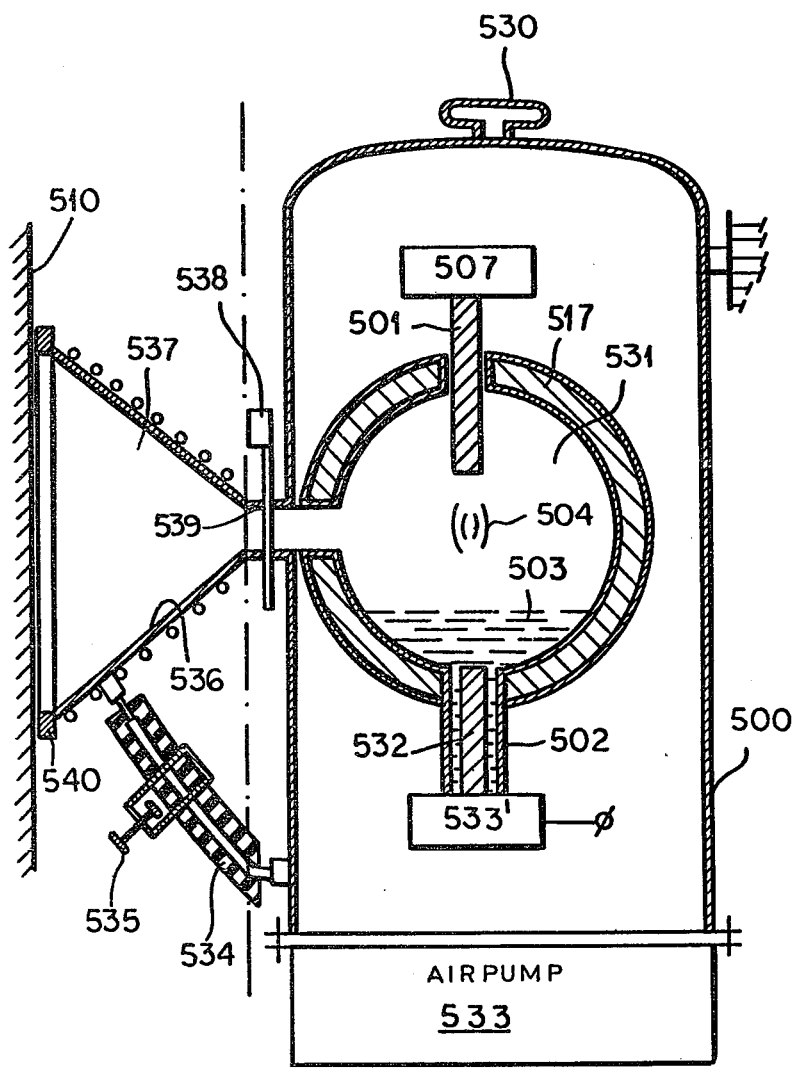
FIG. 6 is an axial cross-sectional view of a highly compact portable apparatus for carrying out the method of the present invention.

As is apparent from FIG. 1, the basic apparatus can include a vacuum chamber, not shown, which can be similar to the vacuum chamber of FIG. 6 and in which a metal electrode 1 can be fed by an electrode feeder 7 toward an electrode body 2 to form the pool 3 of molten metal with which the arc 4 is struck.

The electrode body 2 is held in a fixture or holder 5 and the direct-current source applies the arc current across the electrode 1 and the body 2 via a conventional arc stabilizing circuit represented at 8.

It has been found to be advantageous to provide the relatively small cross-section electrode 1 with a thermal regulator 6 tending to prevent overheating of this electrode.

Since the cross section of body 2 is substantially larger than that of the electrode 1, the pool 3 lies in a concave recess formed in situ in the body 2.

EXAMPLE

The apparatus of FIG. 1, utilizing electrodes 1 andd 2 of titanium, aluminum, tungsten, tantalum or copper, strikes an arc at a temperature of 5000° to 7000° to generate vapor of the metal of the pool 3 which traverses the distance of 10 to 15 cm to the substrate 10 and form a coating of the metal thereon. The pool 3 can be formed by a mixture of metal contributed by the electrodes 1 and 2, thereby depositing an alloy of the metals of the two electrodes upon the substrate. Preferably the electrode is composed of titanium while the molten metal predominantly consists of aluminum, tungsten, tantalum or copper.

The apparatus of FIG. 1, without substantial modification, can be utilized in a noncrucible method of generating protective coatings of carbides, for producing silicide coatings on the substrate or for forming carbide or silicide and even silicon carbide layers upon the substrate. To deposit silicon carbide-tungsten carbide layers upon tthe substrate, electrode 2 is composed of graphite and electrode 1 of tungsten silicide. The vacuum is initially drawn to $10^{-6}$ torr and maintained at $10^{-5}$ torr or lower. The direct current arc-generating voltage is 100 volts and the arc current 150 amperes. The deposit forms at a rate of about 0.2 grams per minute.

In this case, the apparatus of FIG. 1 is used, again in the usual vacuum chamber, although the electrode 1 can be composed of silicon or carbon while the electrode 2 is composed of a metal whose silicide or carbide is to be formed or, in the case of a deposit of silicon upon the substrate, can also consist of silicon.

For example, when a silicon carbide deposit upon the substrate 10 is desired, the electrode 1 may consist of silicon while the electrode 2 is a carbon block in which a pool 3 of silicon and solubilized carbon is received.

The vapors are transferred to the substrate and deposited in a silicon carbide layer thereon. The substrate may be titanium and the deposit formed on the substrate may be a mixture of titanium silicide andd titanium carbide.

Alternatively, when the electrode 1 is composed of silicon or carbon, and the electrode body 2 is composed of titanium, titanium carbide or silicide can be deposited on a substrate of a different composition.

When a slight oxiding atmosphere is provided in the evacuated chamber, silicon dioxide deposits are formed on the substrate.

Obviously the apparatus of FIG. 1 is particularly effective in the production of semiconductors.

The thermoregulator 6 may be duplicated along the length of the electrode 1 and additional thermoregulators may be provided for the electrode body 2 to prevent overheating thereof.

When either the electrode 1 or the body 2 is composed of silicon and the other is composed of carbon, silicon carbide is generated by the reaction and deposits in a higher purity than that of the original silica and carbon.

When both of the electrodes are composed of silicon, high density silica and silicon deposits can be obtained as is particularly desirable for the coating of semiconductors.

Figure 2:
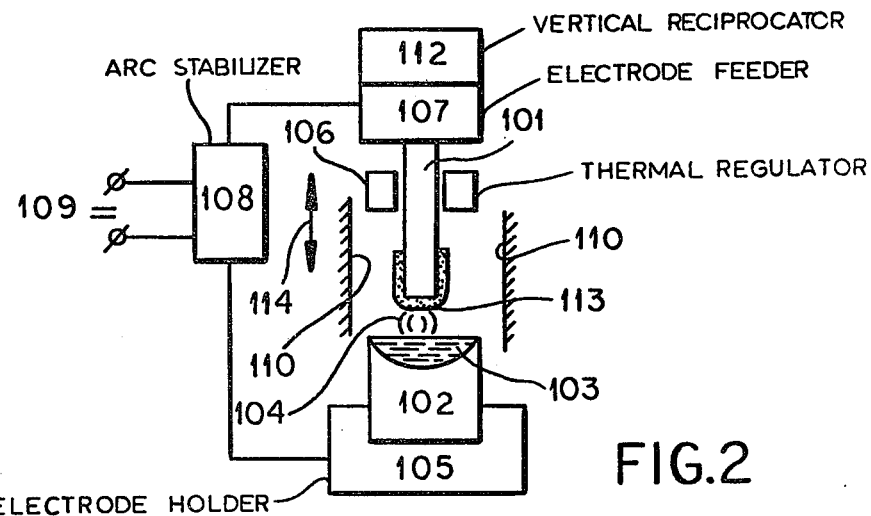
FIG. 2 is a similar view of another apparatus wherein, however, the vapor deposited material is collected on a vertically reciprocatable electrode.

The apparatus of FIG. 2 is generally similar to that of FIG. 1 but operates under somewhat different principles, the evaporation being effected at least in part from the wetted upper electrode 101.

In this figure, elements which correspond to those of FIG. 1 utilize similar reference numerals differing in the hundreds position.

In FIG. 2, the electrode feeder 107 is coupled with a vertical reciprocator 112 which imparts a reciprocation to the electrode 101 in the direction of the arrow 114 so as to periodically plunge the tip of the electrode 101 into the pool 103 of the molten metal formed in the electrode body 102.

Upon rising from this pool to restrike the arc 104, the coating 113 of molten metal upon the electrode 101 is evaporated and the deposit is formed upon the substrate 110.

The electrode body 102 is shown in the holder 105 and the arc current supply is formed by the direct current source 109 and the stabilizer 108 in the manner described, the electrode 101 being provided with the thermoregulator 106.

This system has been found to be particularly effective, in a modification of the foregoing example, when the electrode 101 is composed of titanium and the pool 103 is formed of aluminum.

Figure 3:
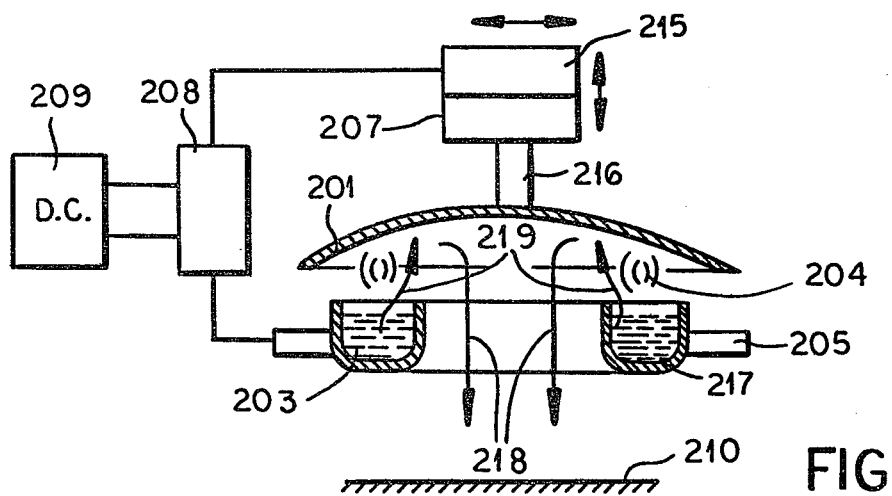
FIG. 3 is a vertical section, also in diagrammatic form, illustrating an apparatus for depositing material upon a substrate disposed below the pool of metal.

In FIG. 3 I have shown an embodiment of the invention in which the vapor is deposited upon a substrate 210 disposed below a crucible 217 in the form of an upwardly open ring containing the molten metal 203, the crucible being mounted in a holder or frame 205.

Here the upper electrode 201 is in the form of a spherical segment which functions as a reflector so that, when an arc 204 is struck between the electrode 201 and the melt in the crucible 217, the vapors pass upwardly as represented by the arrows 219 and are reflected downwardly to focus upon the substrate 210 as represented by the arrows 218.

The direct current source 209 is here connected across the electrode 201 and the crucible 217 via the arc stabilizer 208 and the upper electrode 201, mounted on the rod 216, is vertically positioned by the feeder 207 and horizontally positioned by an auxiliary mechanism 215 which adjusts the position of the electrode 201 over the evaporating metal.

In this embodiment, the electrode 201 can be composed of titanium, molybdenum or tungsten while the molten metal can be composed of aluminum or copper and the crucible 2 of graphite.

Figure 4:
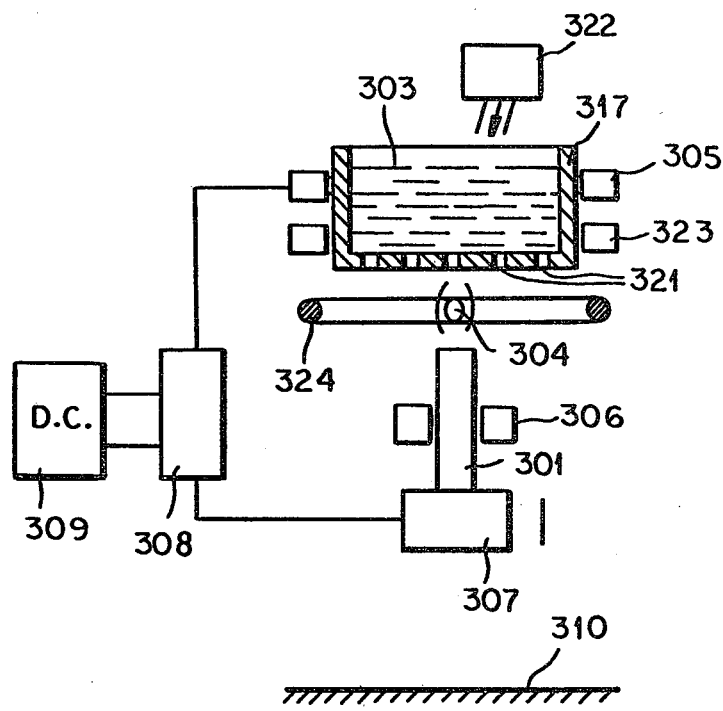
FIG. 4 is a view similar to FIG. 3 illustrating another embodiment of the invention.

In FIG. 4 I have shown another embodiment of the invention in which the vapors flow downwardly to deposit upon the substrate 310.

In this case, the upwardly open crucible 317 containing the molten metal 303 can be supplied with additional molten from a ladle or other sources represented at 322 or with solid metal which is melted in the crucible 317. The latter can be heated by auxiliary means such as an inductive heater 323 and is supported in a holder 305.

The bottom of the crucible 317 is formed with apertures 321 at which droplets of the molten metal appear, these droplets being vaporized by the arc 304 struck between the electrode 301 and the bottom of the crucible 317.

The temperature in the region of the arc can be controlled by an auxiliary inductive means 324 and the electrode 301 can be cooled as represented by the cooling element 306.

Electrode 301 is fed toward the crucible 317 by the electrode holder 307 and the arc is maintained by an arc stabilizer 308 connected to the direct current source 309.

In this embodiment, the molten metal may be copper.

In place of the auxiliary device 324, a substrate to be coated may be provided at this location, e.g. in the form of a titanium ring, which can collect the vapor in the form of a coating.

Figure 5:
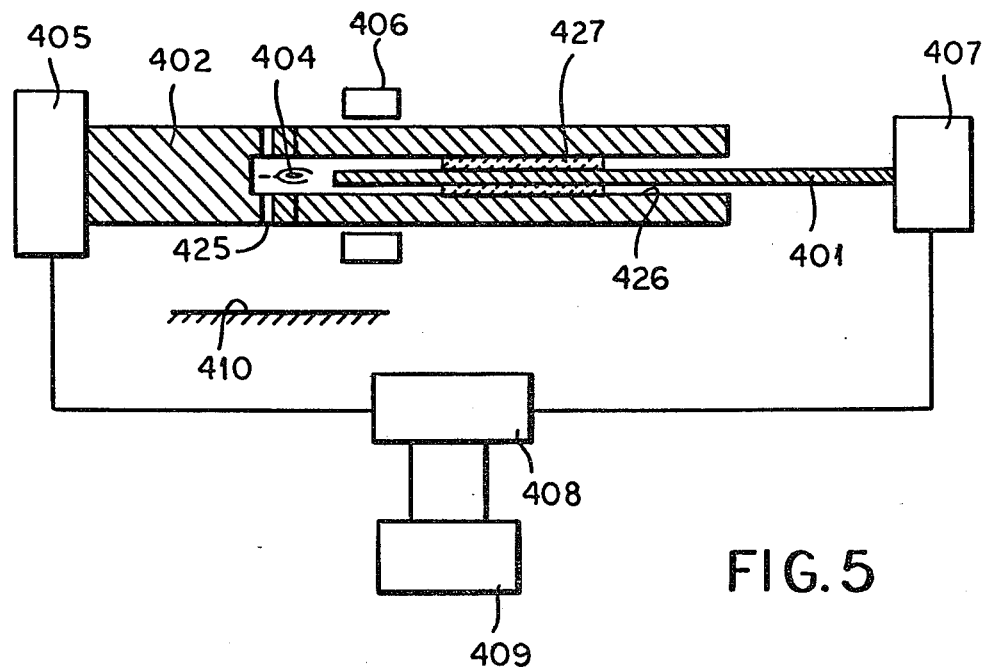
FIG. 5 is an axial cross-sectional view of another apparatus for depositing material upon a substrate according to this invention.

The embodiment of FIG. 5 evaporates the molten metal as it is formed in a closed space, the vapors being discharged through apertures 425 on to the substrate 410.

In this case, the pool of liquid is formed by melting the electrode 402 supported by the holder 405 by feeding the counter electrode 401 via the electrode feeder 407 through a central bore 426 in the electrode 402, the electrode 401 passing through an insulating sleeve 427 forming a guide. A temperature regulator 406 is provided coaxially around the two electrodes adjacent the arc 404 to prevent overheating in the region ahead of the apertures 425. The deposit is formed on the substrate 410.

The current is supplied between the electrodes through the arc stabilizer 408 and the direct current source 409 in the manner described previously.

FIG. 6 shows a portable voltaic arc device for depositing reflective, anticorrosive, protective and semiconductor type metal, silicide and carbide coatings using the principles described previously.

This apparatus comprises a vacuum chamber 500 which is formed at its upper end with a handle 530 enabling the portable unit to be readily transported.

Within this chamber, there is provided a hollow sphere 517, the lower part of which forms a crucible for the molten metal 503, coated internally with a high-temperature heatresistant (refractory) material such as aluminum oxide.

The upper portion of this sphere is coated at 531 with a reflective layer concentrating the heat relfected from the bath back onto the latter.

An arc 504 is struck between an electrode 501 and the bath 503, the electrode being fed by the unit 507 toward the bath as the electrode material is consumed.

Additional metal, e.g. in solid form, is fed to the bath as a rod 532 which also is connected to the feeder 533 so that as the bath is consumed, additional metal is supplied thereto.

The electrode 501 and the bath 503 are connected to opposite terminals of an arc stabilizer and a direct current source in the manner previously described.

A tubular electrode 502 surrounds the rod 532.

The lower part of the chamber 500 is provided with an airpump as represented at 533, the latter evacuating the chamber containing the hollow sphere 517 and, via a vacuum hose 534, via a valve 535, an adapter 536 of outwardly divergent configuration which can be connected to a lateral aperture 525 of the hollow sphere 517.

The chamber 536 can be formed with a heating coil 537 to prevent undesired condensation of vapor thereon.

Between the aperture 525 and the adapter 536 there is provided a vacuum lock 538 and a mounting arrangement 539 for holding a variety of adapters of different shapes and sizes.

The adapter 536 is also formed with a vacuum gasket 540 whereby the adapter can bear against the substrate 510 to be coated.

The portable unit shown in FIG. 6 is carried to the location of the substrate 510 to be coated and the appropriate adapter 536 is mounted on the fitting 539 and the gasket 540 pressed against the surface 510 to be coated. The arc current is supplied and the system is evacuated by the air pump 533, thereby melting the metal and forming the bath 503 within the hollow sphere. The gate 538 is then opened and the vapors permitted to pass onto the substrate 510 at least in part by pressure differential as controlled by the valve 535 maintained between the interior of the sphere 517 and the adapter 536.

Practically any product at any site can be coated and the use of a variety of adapters of different shapes and sizes enables coating of even intricate bodies without moving them from the area in which they are to be used. The device can be collapsible so as to enable it to be used to provide coatings inside ducts and the like.

The apparatus shown in the drawing, without the adapter 536, can be used as a propellant for individuals or equipment in space.

Upon generation of the arc, one need only open the gate 538 to discharge a stream through the aperture 525 and effect propulsion in the opposite direction. The vacuum in space provides a natural vacuum for the device and no air pump 533 is then required. Practically any waste found in space applications can be utilized in the vessel 517 to generate such propulsion.

I claim:

1. A method of depositing a material upon a substrate, comprising the steps of:
   juxtaposing said substrate with a gap between two electrodes spaced apart in a vacuum chamber;
   drawing an initial vacuum in said chamber of a maximum of $10^{-6}$ torr;
   forming a pool of material in a molten state between said electrodes;
   striking an arc with a voltage of 70 to 120 volts and a current of 100 to 250 amperes at least in part between said pool and at least one of said electrodes spaced from said pool, thereby vaporizing material from said pool and depositing vapor of said material on said substrate which is in spaced relationship with said arc and in the path of vapor of material formed from said pool; and
   maintaining the vacuum during the deposition of said material upon said substrate at a maximum of $10^{-5}$ torr.

2. The method defined in claim 1, further comprising the step of intermittently dipping said electrode into said pool to form a coating of said material on said electrode and vaporizing the coating of said material on said electrode with said arc to form material in the vapor state.

3. The method defined in claim 1 wherein said pool is formed by melting a body of said material forming the other of said electrodes and lies in a concavity formed therein.

4. The method defined in claim 3 wherein said cavity is formed by melting said body with said arc.

5. The method defined in claim 1 wherein droplets of said pool are permitted to emerge from an aperture formed in the bottom of a container holding said pool, said arc vaporizing said droplets.

6. The method defined in claim 1 wherein said electrodes are composed of different substances which interact to form the material deposited upon said substrate.

7. An apparatus for depositing material upon a substrate by the method defined in claim 1, comprising means for holding a pool of molten material to be deposited on said substrate, an electrode spacedly juxtaposed with said pool, a source of electric current connected between said electrode and said pool for striking an arc therebetween, thereby vaporizing material from said pool, means for positioning a substrate in spaced relationship to said arc whereby vapor of said material is deposited on said substrate, and means for evacuating the region between said substrate and said arc to at least $10^{-6}$ torr.

8. The apparatus defined in claim 7 wherein said container is a concavity formed in a body of said material by melting a portion thereof.

9. The apparatus defined in claim 7 wherein said container is a crucible containing said pool and formed with apertures at its bottom through which droplets of said pool emerge, said electrode being disposed below said bottom of said container and striking said arc with the bottom of said crucible, thereby vaporizing said droplets.

10. The apparatus defined in claim 7 wherein said electrode and said container are disposed in a portable evacuatable housing formed with a vacuum lock and means for evacuating said housing, an adapter being connectable to said vacuum lock enabling sealing engagement with a substrate to be coated whereby vapor from said housing travels through said adapter to deposit upon said substrate.

* * * * *